United States Patent [19]

Inoue

[11] Patent Number: 4,461,954

[45] Date of Patent: Jul. 24, 1984

[54] ION-PROCESSING METHOD AND APPARATUS

[75] Inventor: Kiyoshi Inoue, Tokyo, Japan

[73] Assignee: Inoue-Japax Research Incorporated, Yokohama, Japan

[21] Appl. No.: 369,542

[22] Filed: Apr. 19, 1982

[30] Foreign Application Priority Data

Apr. 20, 1981 [JP] Japan .................................. 56-59992

[51] Int. Cl.³ .............................................. G21K 1/00
[52] U.S. Cl. ........................... 250/492.2; 219/121 PD
[58] Field of Search ................. 250/492.2, 398, 442.1; 219/121 PG, 121 PX, 121 PD

[56] References Cited

U.S. PATENT DOCUMENTS

| 3,407,281 | 10/1968 | Greene et al. | 219/121 PR |
|---|---|---|---|
| 3,540,993 | 11/1970 | Wurm et al. | 204/298 |
| 3,625,846 | 12/1971 | Murdoch et al. | 204/144 |
| 3,738,828 | 8/1973 | Inoue | 419/30 |
| 3,790,155 | 2/1974 | Longamore | 269/60 |
| 3,925,670 | 12/1975 | Farrell et al. | 250/400 |
| 4,051,381 | 9/1977 | Trotel | 250/492.2 |
| 4,118,630 | 10/1978 | McKenna et al. | 250/492.2 |
| 4,323,589 | 4/1982 | Ray et al. | 427/38 |
| 4,352,974 | 10/1982 | Mizutani et al. | 219/121 PD |
| 4,374,694 | 2/1983 | Blenner et al. | 204/164 |

FOREIGN PATENT DOCUMENTS 47663  3/1982  European Pat. Off. ..... 219/121 PG

Primary Examiner—Janice A. Howell
Assistant Examiner—Constantine Hannaher
Attorney, Agent, or Firm—Karl F. Ross; Herbert Dubno

[57] ABSTRACT

An ion-processing method and apparatus utilizing a slender tubular member having an open end and communicating with an inlet conduit. The tubular member is positioned to bring the open end in spaced juxtaposition with a workpiece across a small gap of a size of 10 and 1000 $\mu$m in an evacuated an ionizable material is supplied into the slender tubular member through the inlet conduit for feeding it into the small gap through the open end. A power supply is provided to energize the supplied gas to form ions thereof and to apply an accelerating potential to the formed ions to propel them in a beam across the small gap to impinge upon a limited area of the surface of the workpiece juxtaposed with the open end of the slender tubular member. The pressure within the small gap, ranging between $10^{-4}$ and $10^{-1}$ Torr, is maintained in excess of the pressure of the surrounding the gap, ranging between $10^{-6}$ and $10^{-4}$ Torr.

26 Claims, 1 Drawing Figure

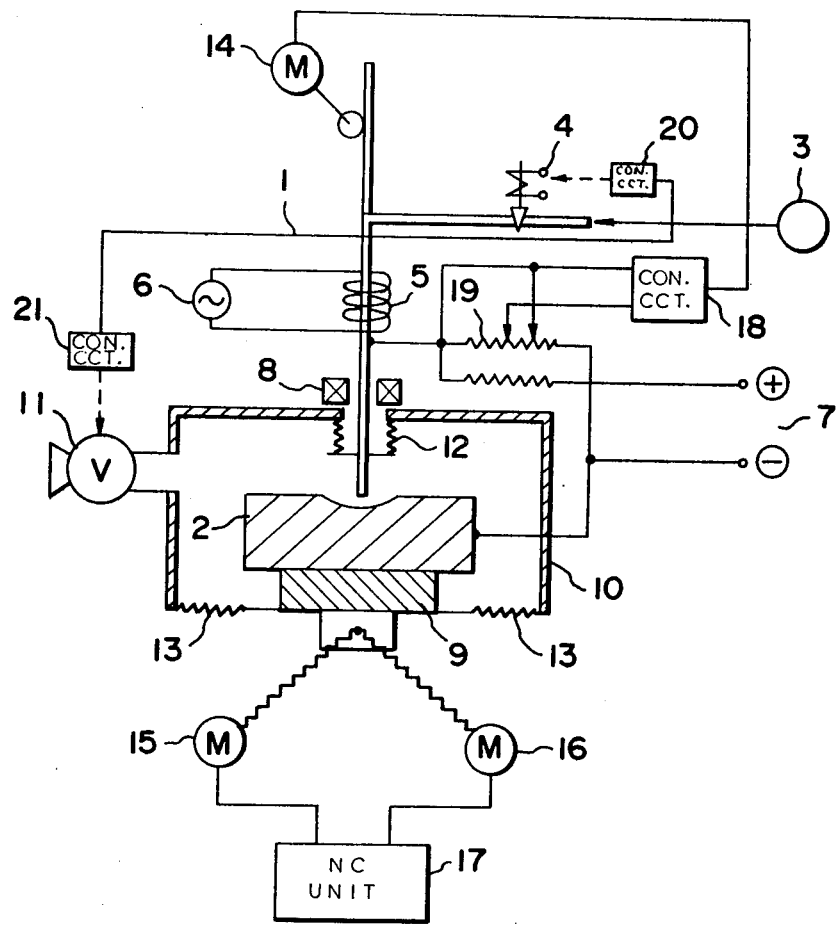

ION-PROCESSING METHOD AND APPARATUS

FIELD OF THE INVENTION

The present invention relates in general to ion-processing techniques such as machining (material removal), etching, implantation, plating and cleaning by energetic ions. More particularly, the invention is concerned with an improved method of and apparatus for processing a workpiece with a beam of energetic ions whereby the mean free path of energetic ions with which the workpiece is bombarded is regulated.

BACKGROUND OF THE INVENTION

Conventional ion-processing apparatus is characterized by massive and complicated equipments including separately an ion chamber, an acceleration chamber, a focusing section and a workpiece mounting chamber. Since the chambers are massive, they cannot easily be evacuated. In addition, difficulties have been encountered in assuring an adequate localization of ions impinging on a desired area and a uniformity of the density of the impinging ions on a localized area. Also, the processing rate has generally been limited to an unsatisfactory level. Thus, the conventional ion-processing art has left much to be desired not only as regards equipment but also as regard to the processing precision and efficiency.

OBJECTS OF THE INVENTION

It is, accordingly, an important object of the present invention to provide an improved ion-processing method capable of achieving the machining, etching, implantation, plating and cleaning of a workpiece surface with an energetic beam of ions with increased efficiency and precision.

A further important object of the invention is to provide an improved ion-processing apparatus which is adapted to carry out the improved method and is relatively simple in structure and organization and relatively compact.

SUMMARY OF THE INVENTION

In accordance with the present invention there is provided, in a first aspect thereof, a method of processing a workpiece with a beam of energetic ions, which method comprises the steps of: positioning a slender tubular member to bring its open end into spaced juxtaposition with the workpiece across a small gap of a size ranging between 10 and 1000 $\mu$m in an evacuated space; supplying the tubular member with an ionizable material in the form of gas or vapor (hereinafter: ionizable gas) for feeding it into the small gap through the open end; energizing the supplied gas to form ions thereof and applying an electrical potential to the formed ions to propel them in a beam across the small gap to impinge onto a limited area of the surface of the workpiece juxtaposed with the open end of the slender tubular member; and maintaining the pressure within the small gap in excess of the pressure of the space surrounding the small gap.

The small gap defined between the open end of the slender tubular member and the workpiece is preferably of a size not greater than 100 $\mu$m and more preferably not in excess of 50 $\mu$m. In addition, the pressures of the space and within the small gap are maintained preferably in the range between $10^{-6}$ and $10^{-4}$ Torr and in the range of $10^{-4}$ and $10^{-1}$ Torr, respectively. The pressure within the small gap is maintained desirably at least by one order of magnitude in Torr greater than the pressure of the space.

The gas forming ions may be argon, nitrogen, hydrogen and/or oxygen. The gas may also be of a substance selected from the group which consists of polyhalogenated hydrocarbons containing fluorine and chlorine (marketed as "Freons"), fluorides and chlorides. These gases are chemically reactive with the workpiece material and thus can provided the action of chemical reaction in addition to the mechanical action of energetic ions impinging upon the workpiece.

The invention also provides, in a second aspect thereof, an apparatus for processing a workpiece with a beam of ions, which apparatus comprises: a slender tubular member having an open end and communicating with an inlet conduit; means for positioning the slender tubular member to bring the open end into spaced juxtaposition with the workpiece across a small gap of a size range between 10 and 1000 $\mu$m in an evacuated space; means for supplying an ionizable gas into the slender tubular member through the inlet conduit and feeding the gas into the small gap through the open end; means for energizing the supplied gas to form ions of the thereof and applying an electrical potential to the formed ions to propel them in a beam across the small gap to impinge on a limited area of the surface of the workpiece juxtaposed with the open end of the slender tubular member; and means for maintaining the pressure within the small gap in excess of the pressure of the space surrounding the small gap.

Specifically, the last-mentioned means includes a receptacle for receiving the workpiece and at least a portion of the open end of the slender tubular member and vacuum pump means for maintaining the pressure of the space within the receptacle in range between $10^{-6}$ and $10^{-4}$ Torr. The supply means includes valve means constituting a portion of the pressure-maintaining means and arranged between the inlet conduit and a source of the gas. The valve means is adjustable to maintain the pressure within the small gap in a range between $10^{-4}$ and $10^{-1}$ Torr.

Preferably, means is provided which is responsive to a change in the pressure within the small gap for controlling at least one of the vacuum pump means and the valve means. In addition, means is provided which is responsive to a change in the gap size for relatively displacing the slender tubular member and the workpiece so as to maintain the gap size substantially at a predetermined value. Means is also provided for relatively displacing the workpiece and the slender tubular member in a plane substantially orthogonal to the longitudinal axis of the slender tubular member along a prescribed path to successively process the workpiece surface in a scanning manner over a preselected area thereof.

It is desirable that the tubular member be composed at least in part of an electrically conductive material to constitute one of a pair of electrodes with respect to the workpiece constituting the other electrode for establishing the said electrical potential therebetween. Preferably, the slender tubular member is composed at least at a portion of the open end of such electrically conductive material. The tubular member may have an inner diameter ranging between 0.1 and 5 mm.

Preferably, means is further provided for applying a magnetic field to the beam of energetic ions in the region of the small gap to controlledly facilitate dispersion of the ions in the beam impinging on the workpiece. The magnetic field should preferably be of a flux density not less than 500 Gauss.

BRIEF DESCRIPTION OF THE DRAWING

These and other features of the present invention as well as advantages thereof will more readily be understood from a reading of the following description of a certain preferred embodiment thereof, taken with reference to the accompanying diagrammatic drawing in which the sole FIGURE is a view partly in section and partly in a schematic form illustrating an apparatus according to the present invention.

SPECIFIC DESCRIPTION

Referring to the drawing, a slender tube 1 is positioned to bring its open end into spaced juxtaposition with a workpiece 2 across a small gap. The slender tube 1, which has an inner diameter preferably ranging between 0.1 and 5 mm, is furnished with an ionizable gas from a source 3. The flow of the gas into the slender tube 1 through an inlet conduit is controlled by a valve 4 arranged between the source 3 and the inlet conduit. A coil 5 is wound around the slender tube 1 and energized by a high-frequency power supply 6 to ionize the gas therein. DC output terminals 7 are connected to the slender tube 1 and the workpiece 2 to apply an ion accelerating voltage thereacross to energize the ions within the tube 1. The workpiece 2 and the tube 1 are shown as connected with negative and positive poles of the DC supply 7, respectively. When the tube 1 is composed of an insulating material such as glass, the conductor leading from the positive pole of the ower supply 7 is arranged to pass through the body of the tube 1 and to terminate on the inner wall thereof. A further electromagnetic coil 8 is provided surrounding the slender tube 1 and energized by a power supply (not shown) to focus a beam of the energized ions onto a limited area of the surface of the workpiece 2.

A lower portion of the slender tube 1 and the workpiece 2 which is securely mounted on a table 9 are accommodated in a vacuum chamber 10 which is evacuated by a vacuum pump 11. The space within the chamber 10 is hermetically sealed by insulating bellows 12 and 13. The slender tube 1 is movable vertically along a Z-axis by means of a motor 14 and guided movably into the chamber 10 via the bellows 12. The table 9 is arranged so as to be movable horizontally by means of a pair of motors 15 and 16. The motor 15 is arranged to displace the workpiece 1 along an X-axis and the motor 16 is arranged to displace the workpiece 1 along a Y-axis orthogonal to the X-axis in the horizontal plane. A drive controller 17, constituted by a numerical-control (NC) unit, is provided to furnish the motors 15 and 16 with drive signals to allow the lower end of the slender tube 1 to effectively move in a scanning manner over a desired area or path on the workpiece 2. The gap distance between the lower end of the tube 1 and the workpiece 2 is controlled by a control circuit 18 which responds to a voltage drop sensed at a detecting resistor 19 across the tube 1 and the workpiece 2 to act on the Z-axis motor 14. In this manner, the gap is held at a distance ranging between 10 and 1000 $\mu$m, preferably not greater than 100 $\mu$m and more preferably not greater than 50 $\mu$m.

The vacuum within the chamber 10 is maintained at a level depending on the types of processing the workpiece 2, e.g., at a pressure of $10^{-4}$ to $10^{-1}$ Torr when the workpiece 2 is to be ion-etched and at a pressure of $10^{-6}$ to $10^{-4}$ Torr when the workpiece 2 is to be ion-implanted. The ionizable gas (which term includes a mixture of gases) introduced into the slender tube 1 may be at least one of the following gases argon (Ar), nitrogen (N2), oxygen (O2) and hydrogen (H2, H), or may be one of Freon (trade name) gases or chloride gas. The latter gases are employed when their chemical reactive actions with the workpiece material is to be added to the mechanical action by their ions impinging on the workpiece with an elevated kinetic energy. The control valve 4 is adjusted to regulate the flow of the ionizable gas into the tube 1 while the chamber 10 is evacuated to maintain the pressure therein at an adequate level and to expel impurities in the working region between the tube 1 and the workpiece 2.

The gaseous particles introduced into the tube 1 are subjected to energization by the high-frequency coil 5 and thereby ionized at least in most part or partially while flowing through the tube 1. A high-gradient electrical field in the range between 1 and 10 kV is established by the terminals 7 to energize and accelerate the ionized particles which are also focused by the action of the electromagnetic coil 8. As a result, a narrow beam of energetic ions is provided and ejected through the end opening of the tube 1 to impinge on the surface of the workpiece 2 for a desired ion processing purpose.

For a machining operation, for example, the workpiece 2 may be displaced to expose its successive areas to the beam of energetic ions. A path of displacement determined by a desired contour or cavity to be machined in the workpiece 2 is preprogrammed in the NC unit 17 and reproduced in the form of drive pulses furnished to the motors 15 and 16. As the workpiece 2 is displaced along a prescribed path or a prescribed set of successive paths, the beam of energetic ions continuously projected from the slender tube 2 progressively removes material in a scanning manner from the workpiece so that the desired contour or cavity is eventually generated in the workpiece 2. In this manner, for example, a rectangular cavity can be formed by causing the ion beam to repetitively traverse a raster scan pattern between the preprogrammed x-y limits and removing additional material during each scan pattern until it arrives at the specified depth. Likewise, a nonrectangular contour cavity may be generated by causing the ion beam to scan single lines of varying length which form a pattern which is repeated at progressively greater depths until the specified depth is reached.

In an ion-etching operation, a chemically reactive gas such as a gas of CnFm family is supplied from the source 3 into the slender tube 1 where it is ionized. The chemically reactive ions are thus provided so as to bombard the workpiece 2 therewith. Etching is effected by a combination of ion impingement mechanical action and ion reaction with the workpiece material, which assures an enhanced processing efficiency and rate. The reactive gases for use may also include halogen gases such as Cl, F, I and Br and halide gases.

Since the guide tube 1 is used, is slender and is juxtaposed with the workpiece 2 across a small gap distance, the highly effective supply of ions and their selective ejection onto a limited area of the workpiece surface are achieved, thus enhancing both ion processing efficiency and precision.

The principles of the invention are applicable to ion-plating, ion-implantation and ion-cleaning as well.

An ionizable gas supplied into the slender tube 1 may also be ionized by applying a high voltage across the tube 1 and the workpiece 2, by subjecting the gas to a high energy beam of energetic particles such as electrons or of laser, and/or by subjecting the gas to an electrical discharge which is preferably pulsed. The volume of the gas supplied into the tube 1 is preferably controlled in response to the gap voltage across the tube 1 and the workpiece 2. The gap voltage is generally detectable in proportion to the gap distance. The vacuum pump 1 may also be regulated to control the vacuum pressure within the chamber 10 in conjunction with the volume of the gap supply and/or the gap distance.

It has been found to be critical in the arrangement described to regulate the mean free path of energetic ions for impingement onto the workpiece surface. To this end, the small gap size described needs to be maintained. In addition, the vacuum pressure needs to be controlled locally. It has been found that the pressure within the small gap should be maintained in the range between $10^{-4}$ and $10^{-1}$ Torr while the pressure of the space surrounding the small gap within the chamber 10 should be maintained in the range between $10^{-6}$ and $10^{-4}$ Torr. A predetermined pressure difference of at least one order in Torr between the small gap and the atmosphere has been found to be desirable.

The pressure within the small gap may be maintained by continuously replenishing the gas into the slender tube 1 from the source 3. The valve 4 is adjusted to establish a desired volume flow of the gas and hence pressure within the gap. A change in the pressure in the gap may be detected at the sensing resistor 19 and a control circuit 20 provided to respond to the detected pressure change to control the valve 4. Likewise, the pressure of the space surrounding the small gap within the chamber 10 is regulated by the vacuum pump 11. A control circuit 21 associated with the vacuum pump 11 may also be provided to responds to the signal detected at the sensing resistor 19.

The slender tubular member 1 is preferably composed of an electrically conductive material such as tungsten or copper. In this case, the power supply 7 is used to energize the gas supplied from the source 3 and conducted through the tube 1 to form ions of the gas and to apply an acceleration potential to propel the formed ions in a beam across the small gap and to impinge on the workpiece. The coil 5 and the power supply 6 may then be dispensed with.

The coil 8 may, as energized by an external power supply, be used to apply a magnetic field to the energetic ions in the region of the small gap. It has been found that the magnetic field of a flux density in excess of 500 Gauss is particularly effective to controlledly facilitate dispersion of ions and electrons in a beam and thus the energetic ions impinging on the workpiece in the small gap. In this manner, the precision of processing the workpiece surface with an energetic ion beam has been found to be markedly increased.

What is claimed is:

1. A method of processing a workpiece with a beam of energetic ions, comprising the steps of:
   positioning a slender tubular member to bring an open end thereof into spaced juxtaposition with a workpiece across a small gap of a size ranging between 10 and 1000 μm in an evacuated space;
   supplying said tubular member with an ionizable gas for feeding it into said gap through said open end;
   energizing said supplied gas to form ions thereof and supplying an electrical potential to said ions to propel them in a beam across said small gap to impinge onto a limited area of the surface of said workpiece juxtaposed with said open end; and
   maintaining the pressure within said small gap in excess of the pressure in said space surrounding said small gap.

2. The method defined in claim 1 wherein said gap size is not greater than 50 μm.

3. The method defined in claim 1 or claim 2 wherein the pressures in said atmosphere and within said small gap are maintained in the range between $10^{-6}$ and $10^{-4}$ Torr and in the range between $10^{-4}$ and $10^{-1}$ Torr, respectively.

4. The method defined in claim 1 wherein the pressure within said small gap is maintained so as to be greater by at least one order in Torr than the pressure in said space.

5. The method defined in claim 1 wherein said pressures are maintained by continuously replenishing said ionizable gas into said slender tube member while continuously evacuating said space.

6. The method defined in claim 1 wherein said ionizable gas is at least one substance selected from the group which consists of argon, nitrogen, hydrogen and oxygen.

7. The method defined in claim 1 wherein said ionizable gas is at least one substance selected from the group which consists of polyhalogenated hydrocarbons containing fluorine and chlorine; fluorides; and chlorides.

8. The method defined in claim 1, further comprising the step of applying a magnetic field of a magnetic flux density in excess of 500 Gauss to said ions in the region of said small gap to controlledly facilitate dispersion of said ions impinging on said workpiece in said small gap.

9. The method defined in claim 1, further comprising the step of relatively displacing said workpiece and said slender tubular member in a plane substantially orthogonal to the longitudinal axis of said slender tubular member along a prescribed path to successively process said surface in a scanning manner over a predetermined area thereof.

10. The method defined in claim 1 or claim 9, further comprising the step of displacing said slender tubular member relative to said workpiece in the direction of the longitudinal axis of said slender tubular member to maintain said gap size substantially constant.

11. The method defined in claim 10, further comprising the steps of electrically sensing said gap size to provide a control signal and, in response to said control signal, axially displacing said slender tubular member towards said workpiece so as to maintain said gap size substantially at a predetermined value.

12. The method defined in claim 1 wherein said slender tubular member is composed at least in part of an electrically conductive material to constitute one of a pair of electrodes with respect to said workpiece constituting the other electrode for establishing said electrical potential therebetween.

13. The method defined in claim 12 wherein said slender tubular member is composed at least in a region of said open end of said electrically conductive material constituting said one electrode.

14. The method defined in claim 13 wherein said ions are formed within said small gap under said electrical potential.

15. The method defined in claim 1 or claim 14 wherein said electrical potential ranges between 1 and 10 kV.

16. An apparatus for processing a workpiece with a beam of ions, comprising:
a slender tubular member having an open end and communicating with an inlet conduit;
means for positioning said slender tubular member to bring said open end into spaced juxtaposition with the workpiece across a small gap of a size ranging between 10 and 1000 μm in an evacuated space;
means for supplying an ionizable gas into said slender tubular member through said inlet conduit and feeding said gas into said small gap through said open end;
means for energizing said supplied gas to form ions and applying an electrical potential to said ions to propel them in a beam across said small gap to impinge on a limited area of the surface of said workpiece juxtaposed with said open end; and
means for maintaining the pressure within said small gap in excess of the pressure of said space surrounding said small gap.

17. The apparatus defined in claim 16 wherein the last-mentioned means include a receptacle for receiving said workpiece and at least a portion of said open end of the slender tubular member and vacuum pump means for maintaining the pressure in said space within said receptacle in a range between $10^{-6}$ and $10^{-4}$ Torr.

18. The apparatus defined in claim 17 wherein said supply means includes valve means constituting a portion of said pressure-maintaining means and arranged between said inlet conduit and a source of said gas, said valve means being adjustable so as to maintain the pressure within said small gap in a range between $10^{-4}$ and $10^{-1}$ Torr.

19. The apparatus defined in claim 18, further comprising means responsive to a change in the pressure within said small gap for controlling at least one of said vacuum pump means and said valve means.

20. The apparatus defined in claim 16, further comprising means responsive to a change in said gap size for relatively displacing said slender tubular member at said workpiece so as to maintain said gap size substantially at a predetermined value.

21. The apparatus defined in claim 16 or claim 20, further comprising means for relatively displacing said workpiece and said slender tubular member in a plane substantially orthogonal to the longitudinal axis of said slender tubular member along a prescribed path to successively process said workpiece surface in a scanning manner over a predetermined area.

22. The apparatus defined in claim 16 wherein said tubular element is composed at least in part of an electrically conductive material to constitute one of a pair of electrodes with respect to said workpiece constituting the other electrode for establishing said electrical potential therebetween.

23. The apparatus defined in claim 22 wherein said slender tubular member is composed at least in a region of said open end of said electrically conductive material constituting said one electrode.

24. The apparatus defined in claim 22 or 23 wherein said one electrode is poled to be anodic and said other electrode is poled to be cathodic.

25. The apparatus defined in claim 16 or claim 23 wherein said slender tubular member has an inner diameter ranging between 0.1 and 0.5 mm.

26. The apparatus defined in claim 16 or claim 23, further comprising means for applying a magnetic field of a flux magnetic density in excess of 500 Gauss to said beam of ions in the region of said small gap to controlledly facilitate dispersion of said ions impinging on said workpiece.

* * * * *